(12) United States Patent  
Ok et al.

(10) Patent No.: US 9,397,006 B1
(45) Date of Patent: Jul. 19, 2016

(54) CO-INTEGRATION OF DIFFERENT FIN PITCHES FOR LOGIC AND ANALOG DEVICES

(71) Applicant: International Business Machines Corporation, Armonk, NY (US)

(72) Inventors: Injo Ok, Loudonville, NY (US); Balasubramanian S. Pranatharthiharan, Watervliet, NY (US); Soon-Cheon Seo, Glenmont, NY (US); Charan V. V. S. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/959,407

(22) Filed: Dec. 4, 2015

(51) Int. Cl.
| | |
|---|---|
| *H01L 21/336* | (2006.01) |
| *H01L 27/088* | (2006.01) |
| *H01L 21/8234* | (2006.01) |
| *H01L 29/66* | (2006.01) |
| *H01L 29/10* | (2006.01) |

(52) U.S. Cl.
CPC ...... *H01L 21/823431* (2013.01); *H01L 21/823412* (2013.01); *H01L 27/0886* (2013.01); *H01L 29/1083* (2013.01); *H01L 29/6656* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 8,669,615 B1 * | 3/2014 | Chang | H01L 27/1211 257/347 |
| 8,673,709 B2 | 3/2014 | Lee et al. | |
| 8,890,261 B2 | 11/2014 | Chang et al. | |
| 8,946,038 B2 * | 2/2015 | Hu | H01L 27/0629 257/353 |
| 9,105,510 B2 | 8/2015 | Woo et al. | |
| 2012/0032267 A1 | 2/2012 | Cheng et al. | |
| 2014/0227857 A1 | 8/2014 | Youn et al. | |
| 2015/0115418 A1 | 4/2015 | Wei et al. | |
| 2015/0145070 A1 | 5/2015 | Song et al. | |
| 2015/0170927 A1 | 6/2015 | Cheng et al. | |

FOREIGN PATENT DOCUMENTS

WO  2015099691  A1  7/2015

OTHER PUBLICATIONS

Disclosed Anonymously; "Improved FinFET spacer formation"; IPCOM000217324D; May 7, 2012; 6 pages.
Disclosed Anonymously; "Variable Fin Pitch Transistors having Wraparound Contact";IPCOM000242337D,Jul. 8, 2015; 4 pages.

* cited by examiner

*Primary Examiner* — Calvin Choi
(74) *Attorney, Agent, or Firm* — Cantor Colburn LLP; Jennifer Anda

(57) ABSTRACT

A method includes forming a first set of fins on a substrate; forming a second set of fins on the substrate; forming a gate stack over the fins and substrate; depositing a spacer layer around each fin in the first set of fins and in the second set of fins and the substrate; etching horizontal and vertical surfaces covered by the spacer layer to form spacers around the first set of fins and the second set of fins; etching horizontal and vertical surfaces of the spacer to pull down the spacer around the second set of fins; growing an epitaxy layer around the first set of fins and the second set of fins and growing epitaxy on the first set of fins and on the second set of fins; merging the epitaxy on the first set of fins; and merging the epitaxy on the second set of fins.

20 Claims, 11 Drawing Sheets

CO-INTEGRATION OF DIFFERENT FIN PITCHES FOR LOGIC AND ANALOG DEVICES

BACKGROUND

The present invention relates to metal-oxide-semiconductor field-effect transistors (MOSFET), and more specifically, to fin-type field-effect transistors (finFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

The finFET is a type of MOSFET. The finFET is a double-gate or a tri-gate semiconductor on bulk Si or SOI (semiconductor on oxide, e.g., silicon-on-oxide) device that mitigates the effects of short channels and reduces drain-induced barrier lowering. The "fin" refers to the narrow channel between source and drain regions. A thin insulating oxide layer on either side of the fin separates the fin from the gate.

Size reduction of finFETs, including reduction of the gate length and gate oxide thickness, enables improvement in speed, performance, density, and cost per unit function of integrated circuits. Transistor designs utilizing raised source/drain regions having one or more raised channel regions (i.e., fins) interconnecting the source and drain regions. A gate is formed by depositing a conductive layer over and/or adjacent to the fins. FinFET designs provide better scalability as design requirements shrink and also provide better short-channel control.

SUMMARY

According to an embodiment of the present invention, a method includes forming a first set of fins on a substrate; forming a second set of fins on the substrate; forming a gate stack over the fins and substrate; depositing a spacer layer around each fin in the first set of fins and in the second set of fins and the substrate; etching horizontal and vertical surfaces covered by the spacer layer to form spacers around the first set of fins and the second set of fins; blocking the first set of fins with a protective layer; etching horizontal and vertical surfaces of the spacer to pull down the spacer around the second set of fins; growing an epitaxy layer around the first set of fins and the second set of fins and growing epitaxy on the first set of fins and on the second set of fins; merging the epitaxy on the first set of fins; and merging the epitaxy on the second set of fins to form a semiconductor device with a first set of fins and a second set of fins adjacent to each other. The first set of fins has a fin pitch of less than or equal to 35 nanometers. The second set of fins has a fin pitch of greater than or equal to 40 nanometers. The first set of fins and the second set of fins have different size.

According to an embodiment of the present invention, a semiconductor device, includes a first set of fins patterned on a substrate; a second set of fins patterned on a substrate; and a gate stack arranged over the first set of fins, second set of fins, and the substrate; a spacer arranged around each fin in the first set of fins and around each fin in the second set of fins; a merged epitaxy layer deposited around the first set of fins; and a merged epitaxy layer deposited around the second set of fins. A punch through stopper layer is arranged between the second set of fins and the substrate. A punch through stopper layer is arranged between the second set of fins and the substrate. A height of the spacer in the first set of fins is 10-90% smaller as compared to a height of the spacer in the second set of fins after etching of the first set of fins and the second set of fins.

According to an embodiment of the present invention, a method includes forming a first set of fins on a substrate; forming a second set of fins on the substrate; forming a gate stack over the fins and substrate; depositing a spacer layer around each fin in the first set of fins and in the second set of fins and the substrate; etching horizontal and vertical surfaces covered by the spacer layer to form spacers around the first set of fins and the second set of fins; blocking the first set of fins with a protective layer; etching horizontal and vertical surfaces of the spacer to pull down the spacer around the second set of fins; growing an epitaxy layer around the first set of fins and the second set of fins and growing epitaxy on the first set of fins and on the second set of fins; merging the epitaxy on the first set of fins; merging the epitaxy on the second set of fins to form a semiconductor device with a first set of fins and a second set of fins adjacent to each other; and removing the dummy gate and etching a metal gate, forming a replacement metal gate. The first set of fins has a fin pitch. The second set of fins has a fin pitch. The fin pitch of the first set of fins is smaller than the fin pitch of the second set of fins.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

FinFET integration can be an issue for digital devices having a tight gate pitch (e.g., less than or equal to 90 nanometers (nm) for 14 nm technology node) and analog devices having a large gate pitch (e.g., greater than or equal to 90 nm for 14 nm node) with a thick gate oxide. Large gate pitch can leave little to no room for work function metal (WFM) deposition in devices with a tight fin pitch. As a result, an analog device is often designed with a fin pitch that is at least two times the fin pitch compared to a logic device where the thick gate oxide coating is removed before formation and deposition of the gate (e.g., an active gate for a gate first scheme or a dummy gate for a replacement metal gate (RMG)).

When fin pitch is large (e.g., greater than or equal to 40 nm), it can be difficult to achieve epitaxy merge, which will have an impact on device performance unless the fin is very tall (e.g., greater than or equal to 40 nanometers tall). It can be difficult to integrate a semiconductor device having two different fin heights at a gate etch and spacer formation. With the method disclosed herein, such a semiconductor device can be formed.

Figure 1:
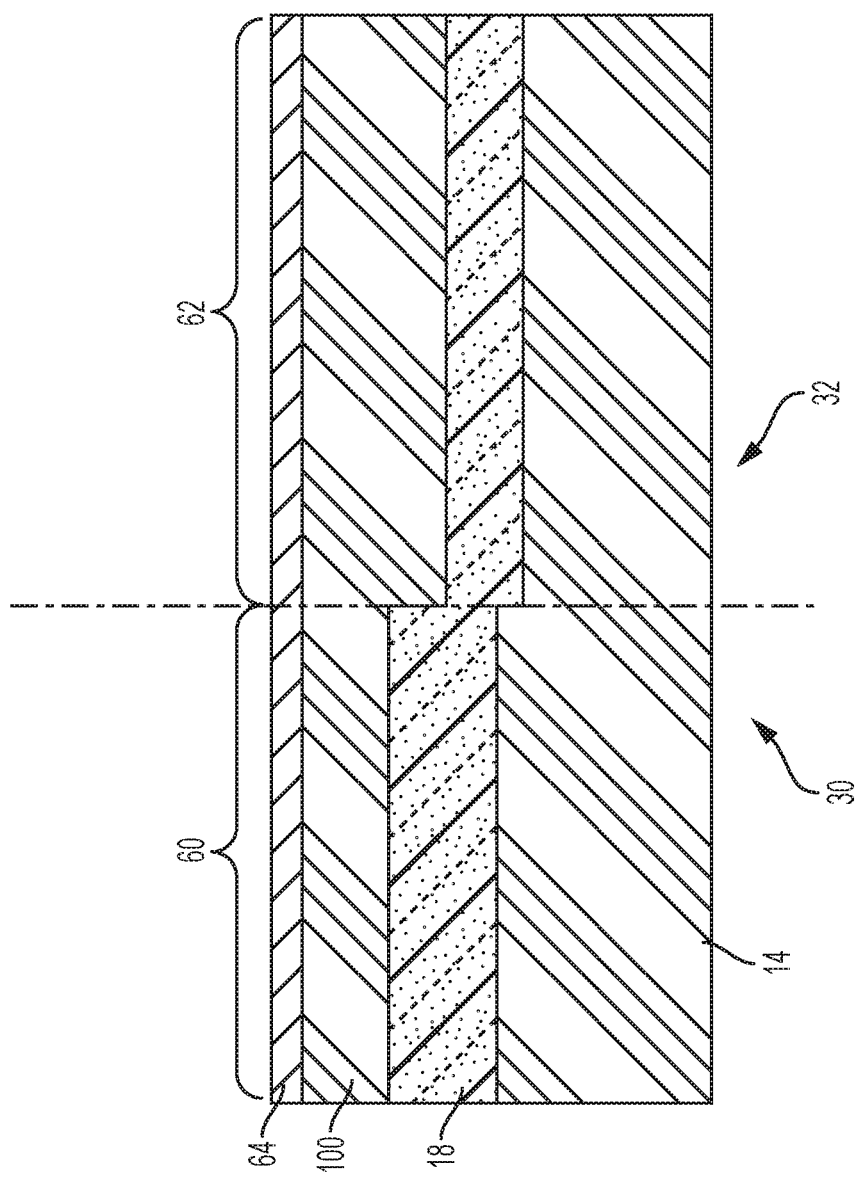
FIG. 1 is a cross-sectional illustration of a finFET structure before formation of fins.

Turning now to the Figures, an exemplary method of making semiconductor devices according to various embodiments is shown. FIGS. 1-4 demonstrate how a bulk fin structure is formed. For example, FIG. 1 is a cross-sectional view of a finFET structure before formation of fins. In FIG. 1, a substrate 14 is shown with a punch through stopper layer 18 present on the substrate. A fin hard mask layer 64 is disposed over the substrate 14, punch through stopper layer 18, and channel material 100. Channel material 100 can be the same as or different from the substrate 14. A first fin region 60 and a second fin region 62 are also shown in FIG. 1. A punch through stopper layer 18 (e.g., isolation region) and channel can be grown sequentially from the substrate 14 by multiple epitaxial process with various dopants. The Punch through stopper layer 18 can be an in-situ doped epitaxial layer or an ex-situ doped epitaxial layer.

Non-limiting examples of substrate 14 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or a combination comprising at least one of the foregoing.

The thickness of the substrate 14 generally varies and is not intended to be limited. For example, the thickness of the substrate 14 can be about 50 micrometers to about 2000 micrometers.

Figure 2:
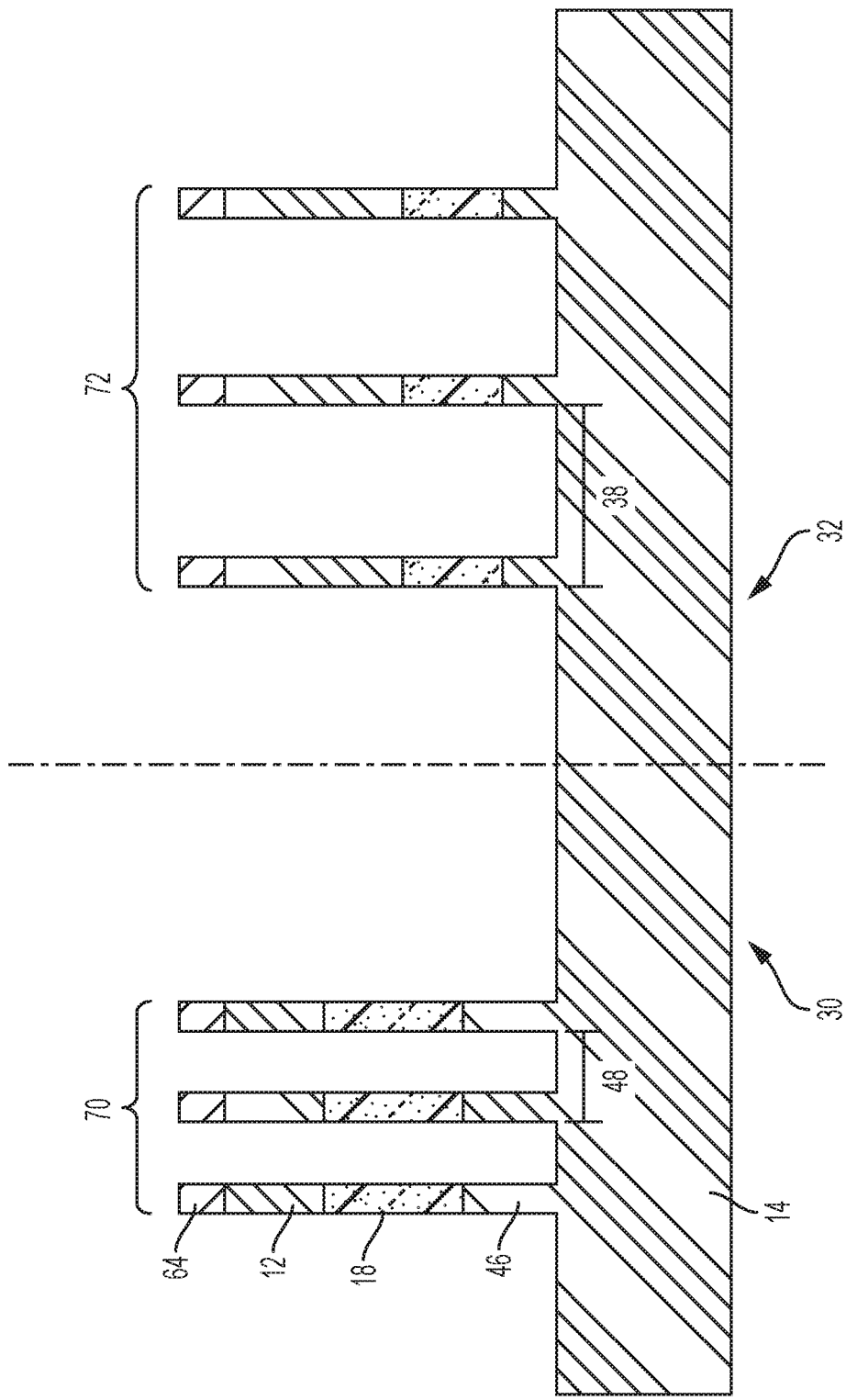
FIG. 2 is a cross-sectional illustration of a finFET structure after formation of fins.

FIG. 2 is a cross-sectional view of the finFET structure of FIG. 1 after formation of fins 12. In FIG. 2, first fins 70 and second fins 72 (also referred to herein as first set of fins 70 and second set of fins 72), can be formed by a lithographic patterning and etching process, by a sidewall imaging process, by an e-beam exposure process, or by an e-beam ultraviolet light exposure process. For example, the first and second fins 70, 72 can be formed by etching material from the first fin region 60 and the second fin region 62 using an etching process such as reactive ion etching (ME).

The first and second fins 70, 72 can have different threshold voltages due to different elemental concentrations (e.g., different silicon germanium concentrations). In one non-limiting example, a fin hard mask layer 64 can be disposed over the first and second active regions fins 70, 72. The first and second fins 70, 72 can have different elemental concentrations, different heights, and different thicknesses for forming two different transistors as will be explained with respect to FIGS. 8-15.

Figure 3:
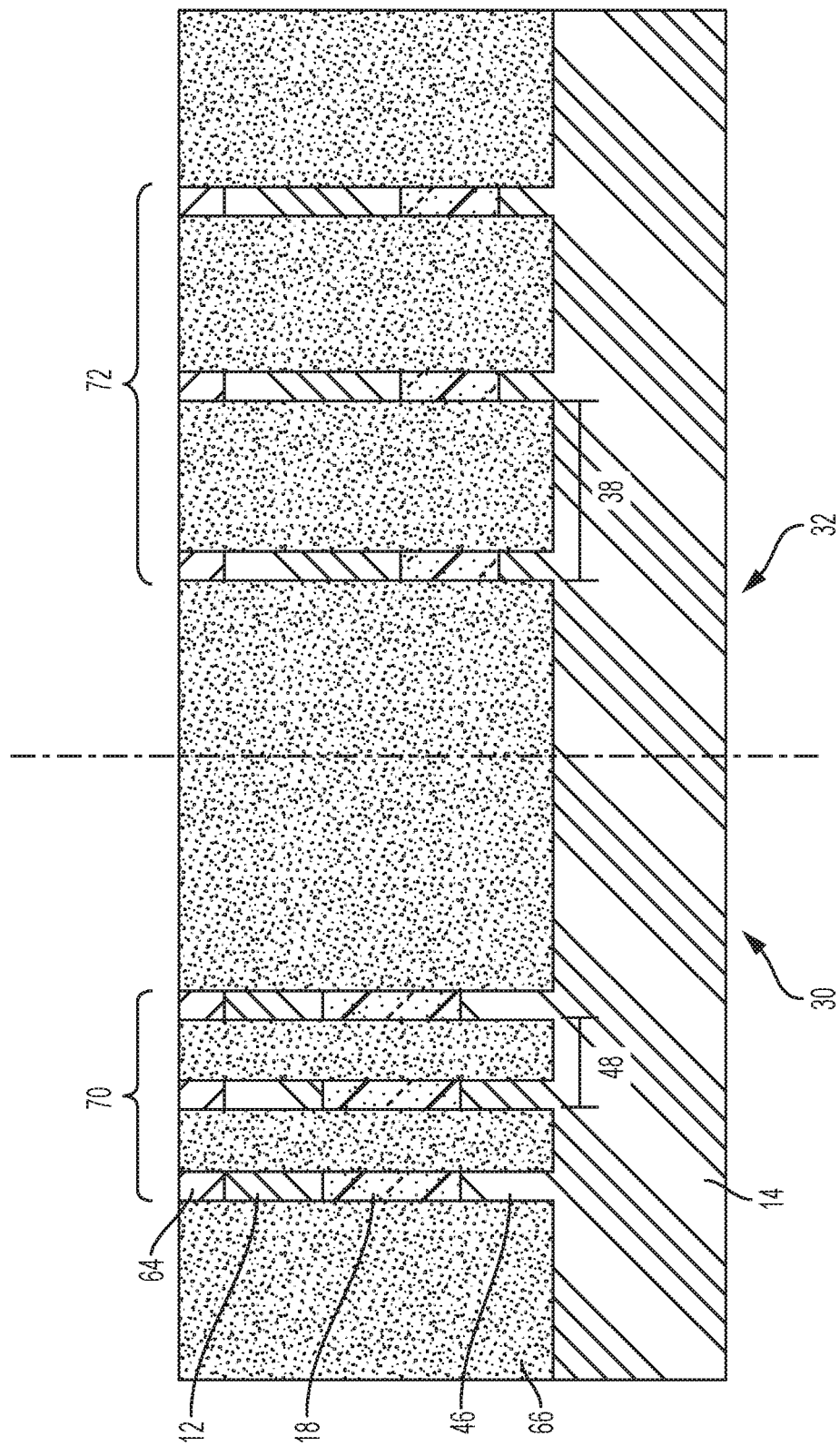
FIG. 3 is a cross-sectional illustration of a finFET structure after formation of fins with the addition of a shallow trench isolation region.

In FIG. 3, shallow trench isolation (STI) regions 66 have been formed in a first fin pitch area 30 and a second fin pitch area 32.

The shallow trench isolation regions 66 are isolation regions that can be formed by etching trenches in the substrate 14 and then filling the trenches with, for example, silicon dioxide. Other oxide materials can be deposited to form the shallow trench isolation regions 66. Non-limiting examples of oxide materials for the shallow trench isolation regions 66 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or a combination comprising at least one of the foregoing.

Figure 4:
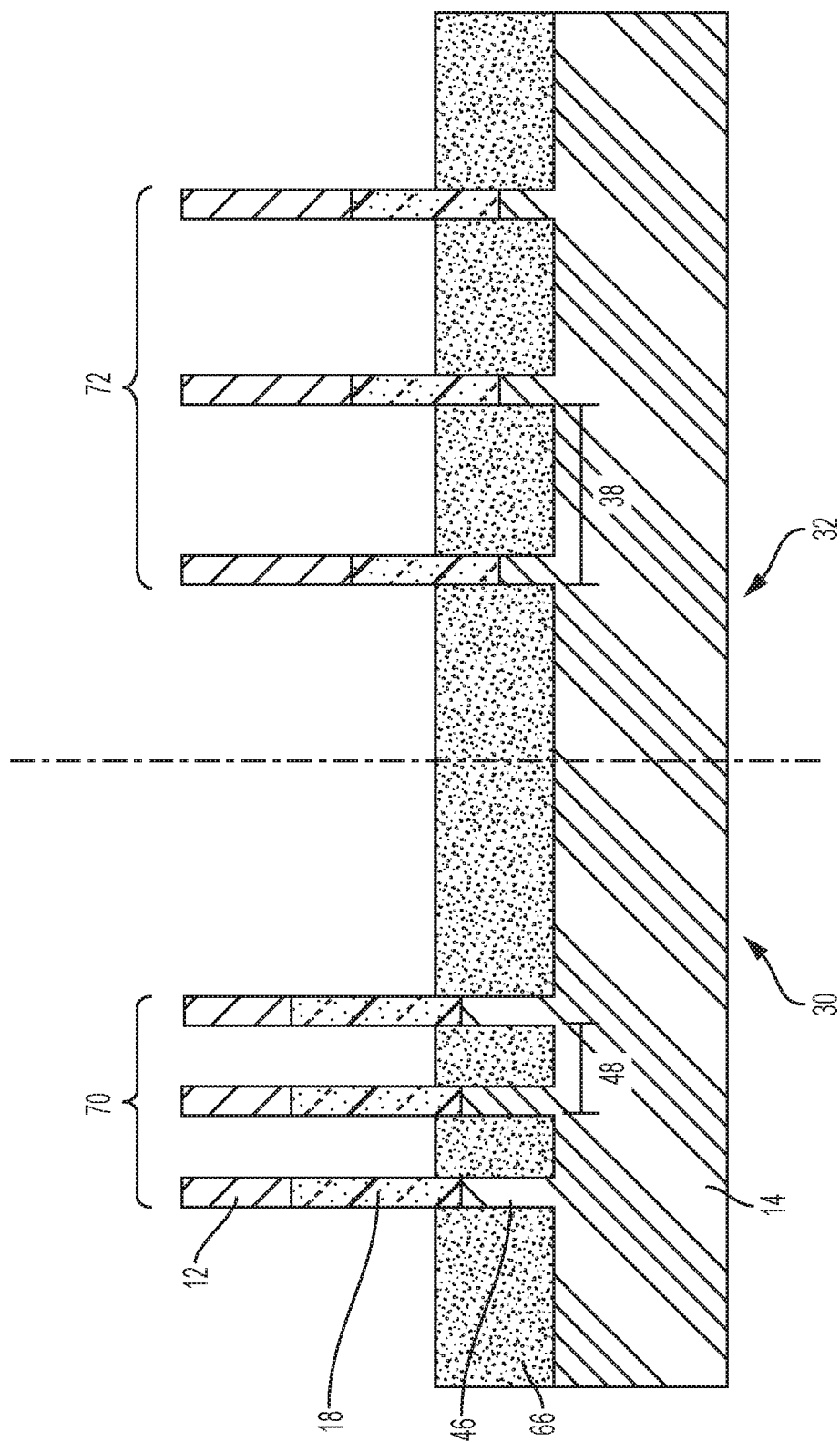
FIG. 4 is a cross-sectional illustration of a finFET structure after formation and reveal of fins by pulling down of the shallow trench isolation region.

FIG. 4 is a cross-sectional side view after recessing the shallow trench isolation regions 66. The shallow trench isolation regions 66 can be recessed by different amounts (different depths) by removing different amounts of the substrate 14.

The shallow trench isolation regions 66 can be recessed such that the shallow trench isolation regions 66 have a thickness of about 4 to about 100 nm, for example, about 6 to about 30 nm.

The etching process employed to recess the shallow trench isolation regions 66 can be any wet or dry etching process.

Figure 5:
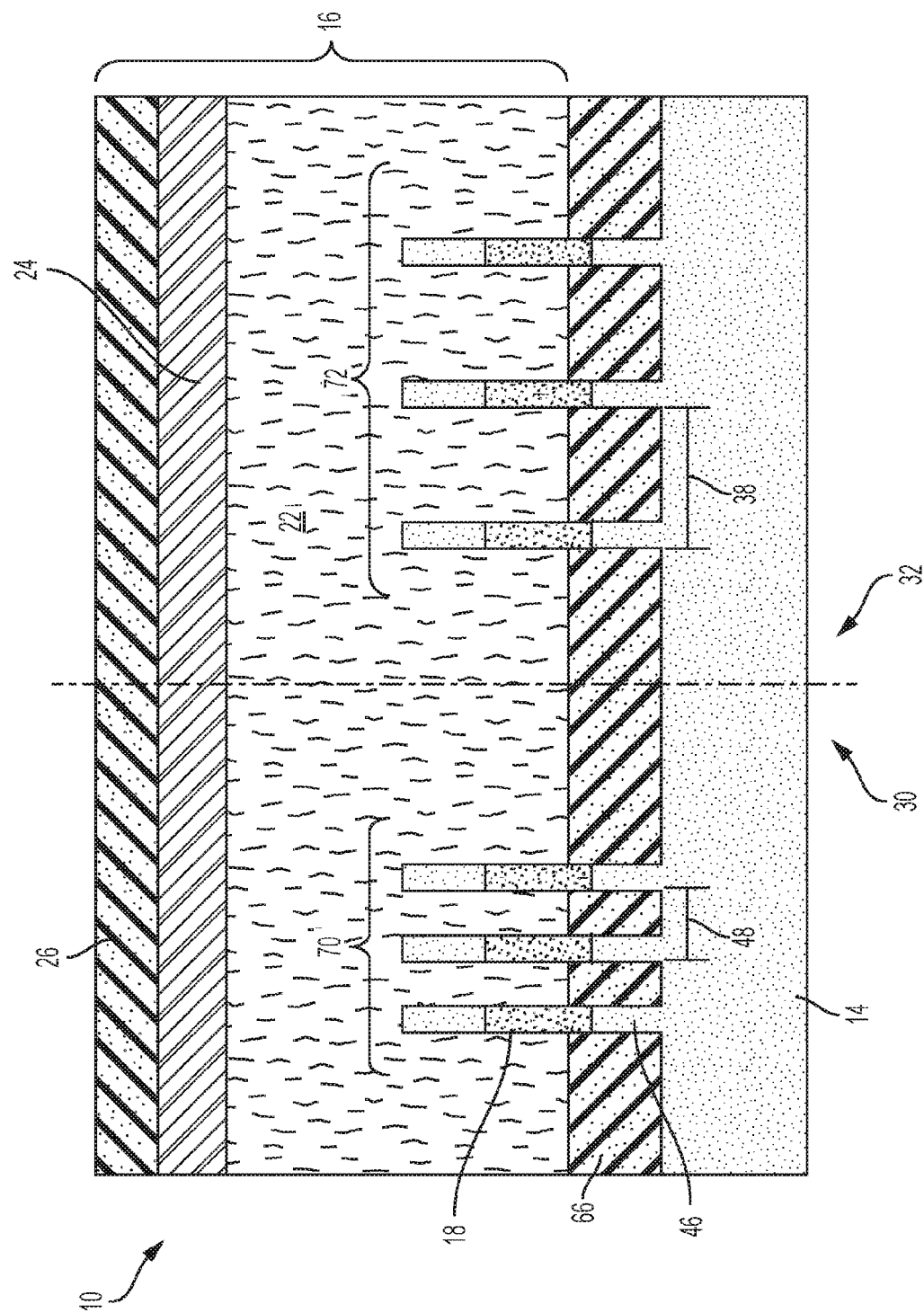
FIG. 5 is a cross-sectional illustration of a finFET structure after formation of fins and gate stack etching.

With reference now to FIGS. 5 to 11, a semiconductor device 10 (e.g., a finFET structure) is illustrated. In FIG. 5, first fins 70 and second fins 72 have been patterned onto a substrate 14 and then a gate stack 16 is formed over fins 70, 72. Although shown side by side in the Figures, it is to be noted that this for illustration purposed only. In an actual finFET structure, fins 70 and 72 are not connected, but rather are located at different areas of the structure. Initially, dummy gate 22, first hard mask layer 24, and second hard mask layer 26 constitute gate stack 16. The first hard mask layer 24 and second hard mask layer 26 can provide protection to the other layers present in the semiconductor device 10 during formation. The gate stack 16 can be an active gate for a first scheme or a dummy gate for a replacement metal gate. In an embodiment, a replacement metal gate can be formed over fins 70, 72 after epitaxy growth. A replacement metal gate (RMG) can be formed over the fin 70. The replacement metal gate can be formed by initially forming a "dummy" gate made of, for example, semiconductor material (e.g. silicon) or dielectric material. The dummy gate material is deposited and etched using known techniques. Then the dummy gate material is removed and replaced with a metal gate material to form the RMG 140. The metal gate material depends on the type of transistor. Non-limiting examples of metal gate materials include titanium, tungsten, tantalum, tantalum nitride, ruthenium, rhenium, tungsten, or a combination comprising at least one of the foregoing.

The first hard mask layer 24, and/or second hard mask layer 26, and/or fin hard mask 64 can comprise any dielectric material (e.g. silicon nitride, silicon dioxide) to assist patterning gates and/or fins.

Punch through stopper layer 18 can be etched onto substrate 14 and fins 70, 72, e.g., punch through stopper layer 18 can be etched onto protrusion 46, part of substrate 14 and can extend vertically upward toward punch through stopper layer 18. The punch through stopper layer 18 can be a doped region configured to prevent source to drain shorts acting similarly to buried oxide in a semiconductor on insulator. The punch through stopper layer 18 can be formed with a block resist pattern and ion implantation prior to fin formation or can be achieved after fin formation. The punch through stopper layer 18 can be formed by forming a spacer to protect the active fins and then the shallow trench isolation recess 66 can then be recessed further and a solid doping layer deposited and this layer then annealed. As previously described herein, a shallow trench isolation recess 66 can be formed within the substrate 14. As can be seen in FIG. 4, first fins 70 (e.g., tight fin pitch) and second fins 72 (e.g., loose fin pitch) can have different punch through stopper layer 18 depths and thickness, which can be achieved by blocking one set of fins while pulling down the shallow trench isolation recess 66 on the other set of fins. As illustrated in FIG. 5, the fin pitch can vary between a first fin pitch area 30 and a second fin pitch area 32 such that fin pitch 48, present in first fin pitch area 30 is smaller and fin pitch 38, present in second fin pitch area 32. A thickness of the punch through stopper layer 18 in second fin pitch area 32 can be smaller with a taller active fin 72 than that in first fin pitch area 30.

Figure 6:
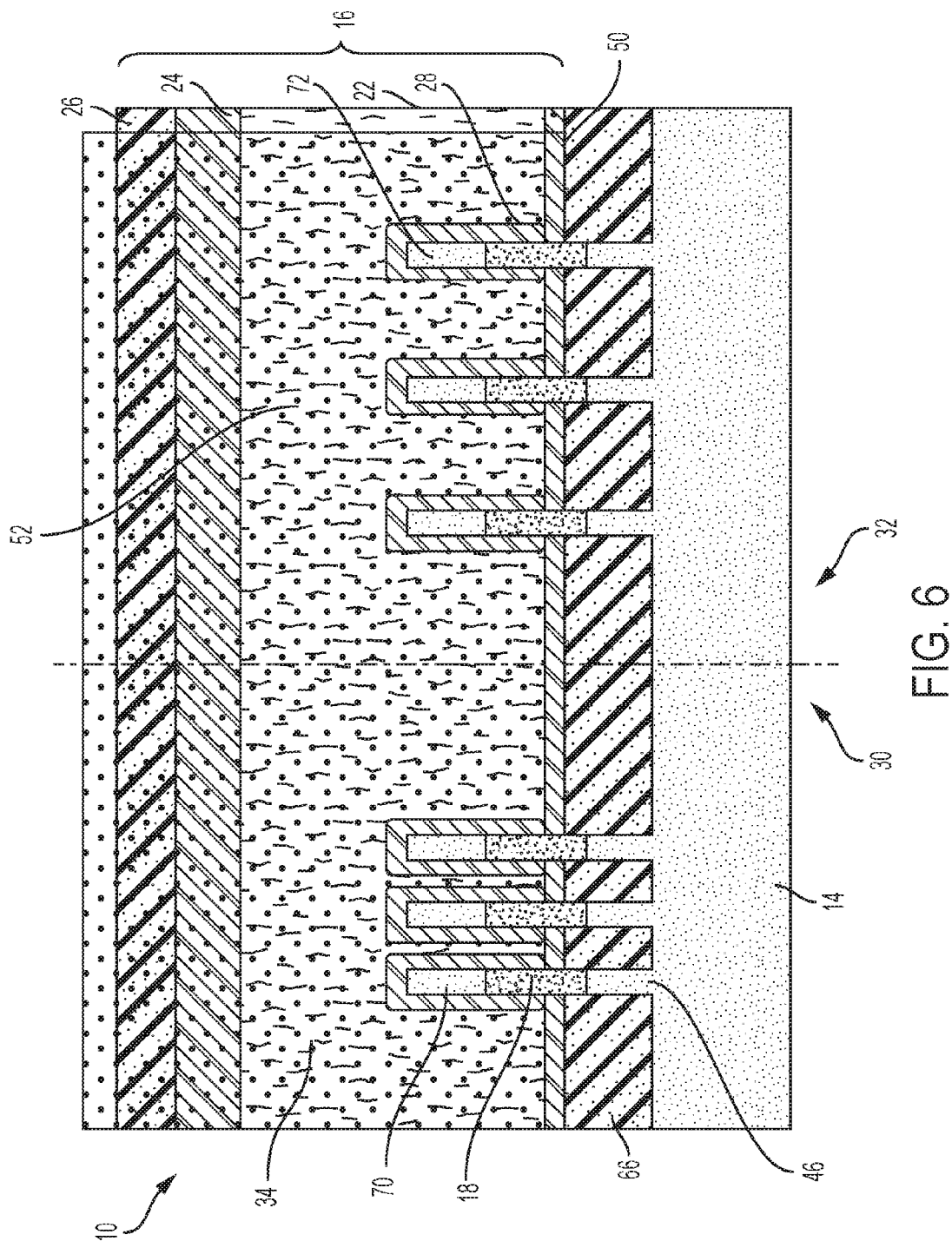
FIG. 6 is a cross-sectional illustration of a finFET structure after spacer deposition.

In FIG. 6, spacers 28 have been formed around fins 70, 72 and punch through stopper layer 18. The spacers 28 are created by forming a layer of spacer material 50 over substrate 14 and shallow trench region 66. An anisotropic etch is then performed to pull (e.g., etch) horizontal surfaces of the spacer layer 50 to remove them using a reactive ion etching (ME) plasma process. Vertical surfaces of the spacer layer or also pulled down. The extent of the etch varies depending upon the amount of time the etch is performed. Deposition material 52 is covers the gate stack etch structure 16.

Figure 7:
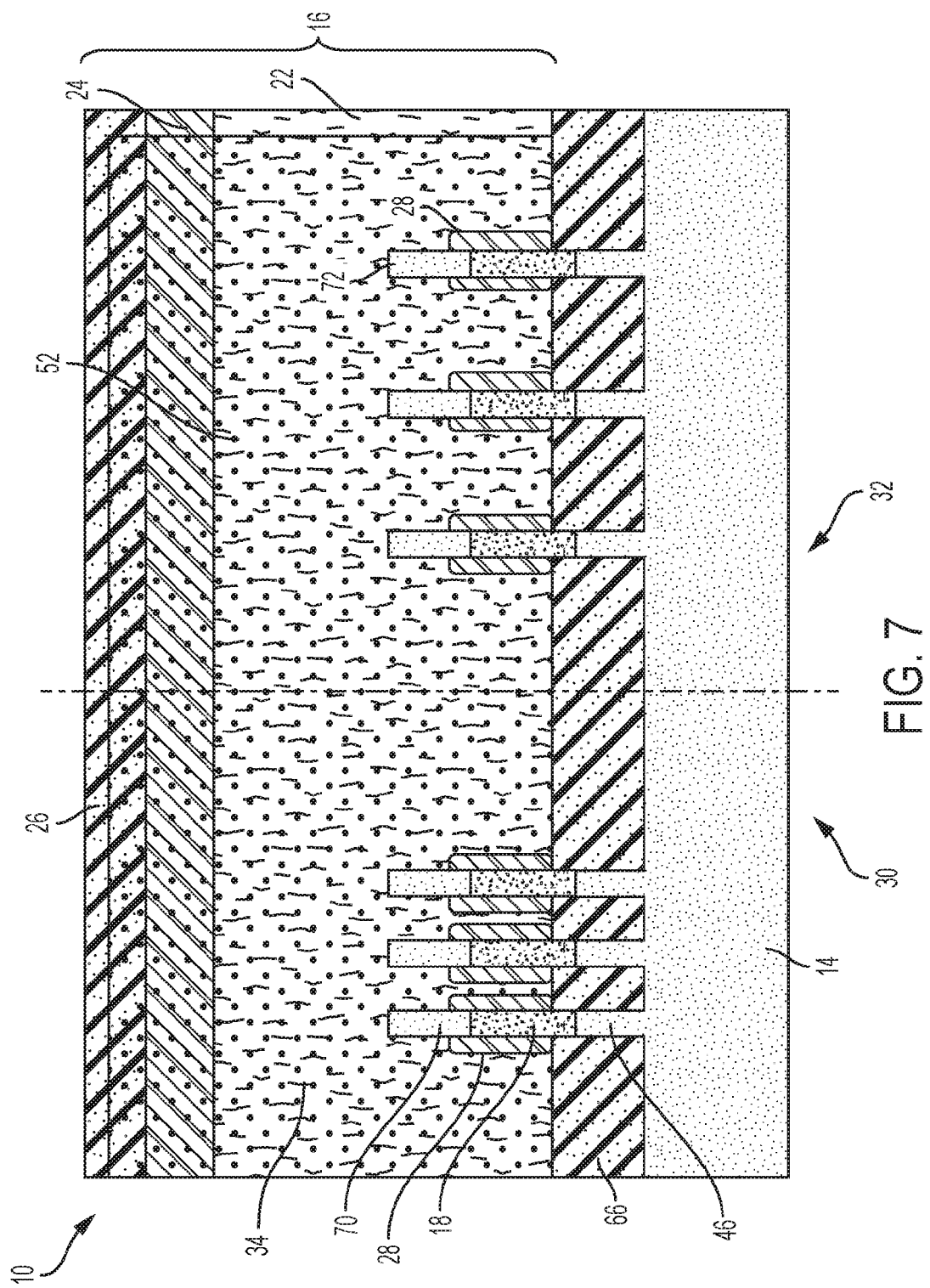
FIG. 7 is a cross-sectional illustration of a finFET structure after a first spacer etch pull down.

In FIG. 7, deposition material 52 is being pulled down over the gate stack etch 16 in a step for a first fin pitch area 30 epitaxy merge. As can be seen in FIG. 7, spacer layer 50 has been pulled down over a portion of fin 70 from spacer layer 50 toward punch through stopper layer 18 to expose a portion of fin 70.

Figure 8:
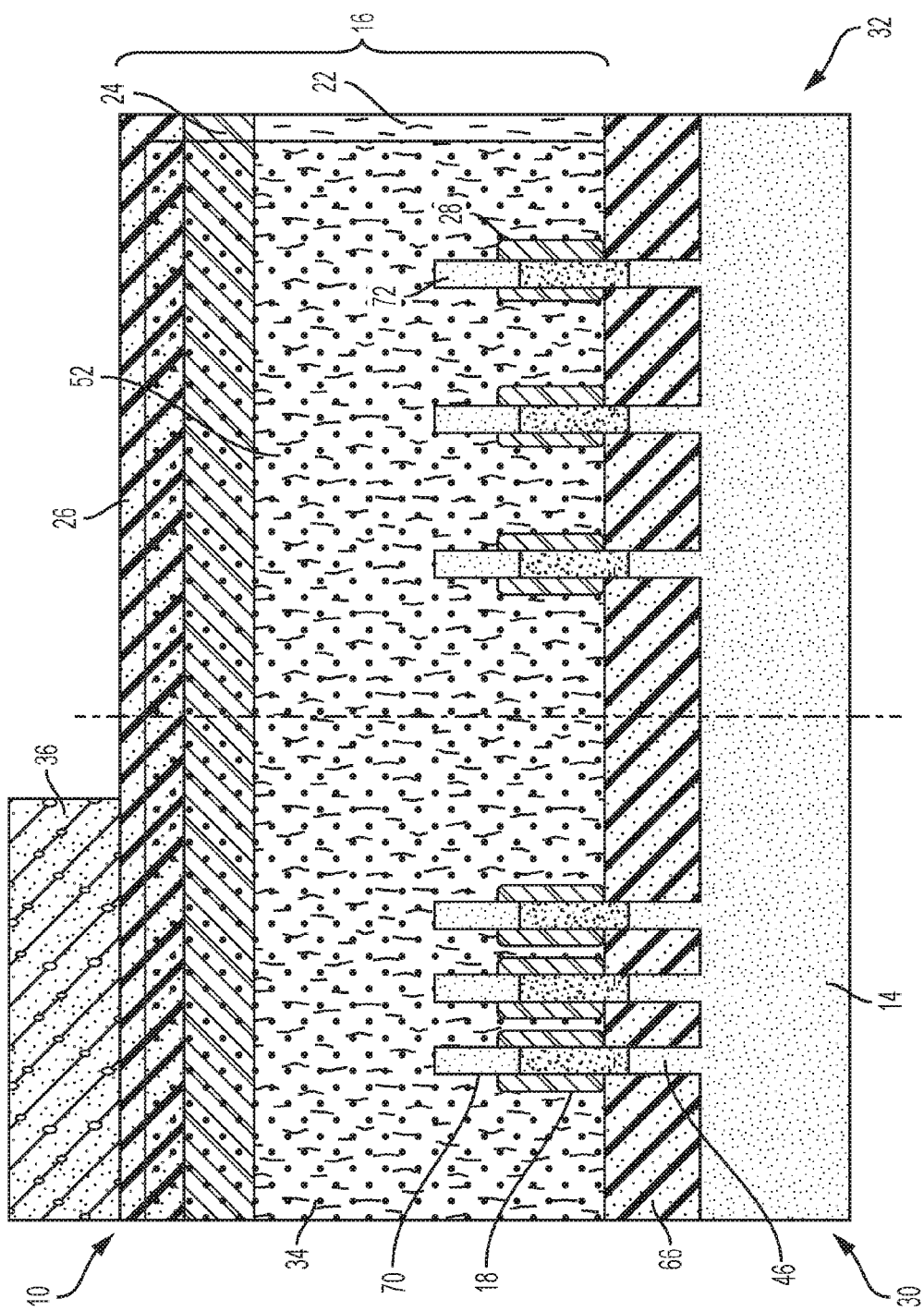
FIG. 8 is a cross-sectional illustration of a finFET structure after blocking a first set of fins on the finFET structure.
Figure 9:
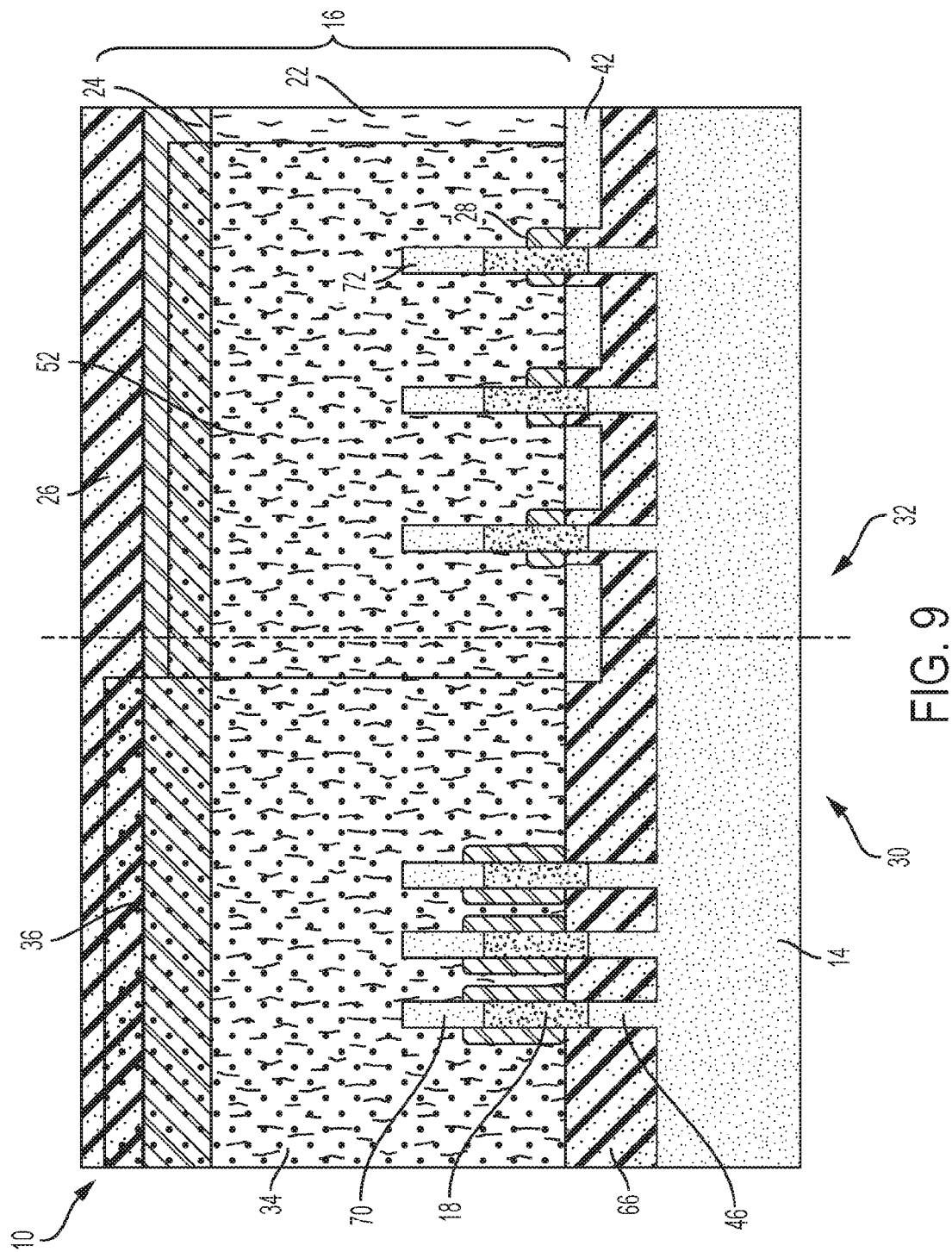
FIG. 9 is a cross-sectional illustration of a finFET structure after a second spacer etch pull down.

In FIG. 8, the first fin pitch area 30 is blocked by blocking layer 36 to protect the first fin pitch area 30, while in FIG. 9, deposition material 52 is being pulled down over gate stack etch 16 in a step to form a second fin pitch area 32.

As demonstrated in FIG. 9, spacer 28 has been pulled down over a portion of fin 70 toward punch through stopper layer 18 to expose a portion of fin 72 using the RIE process. During the spacer 28 pull down process, the shallow trench isolation region 66 outside of the gate spacer and fin spacer can form recess 42.

Figure 10:
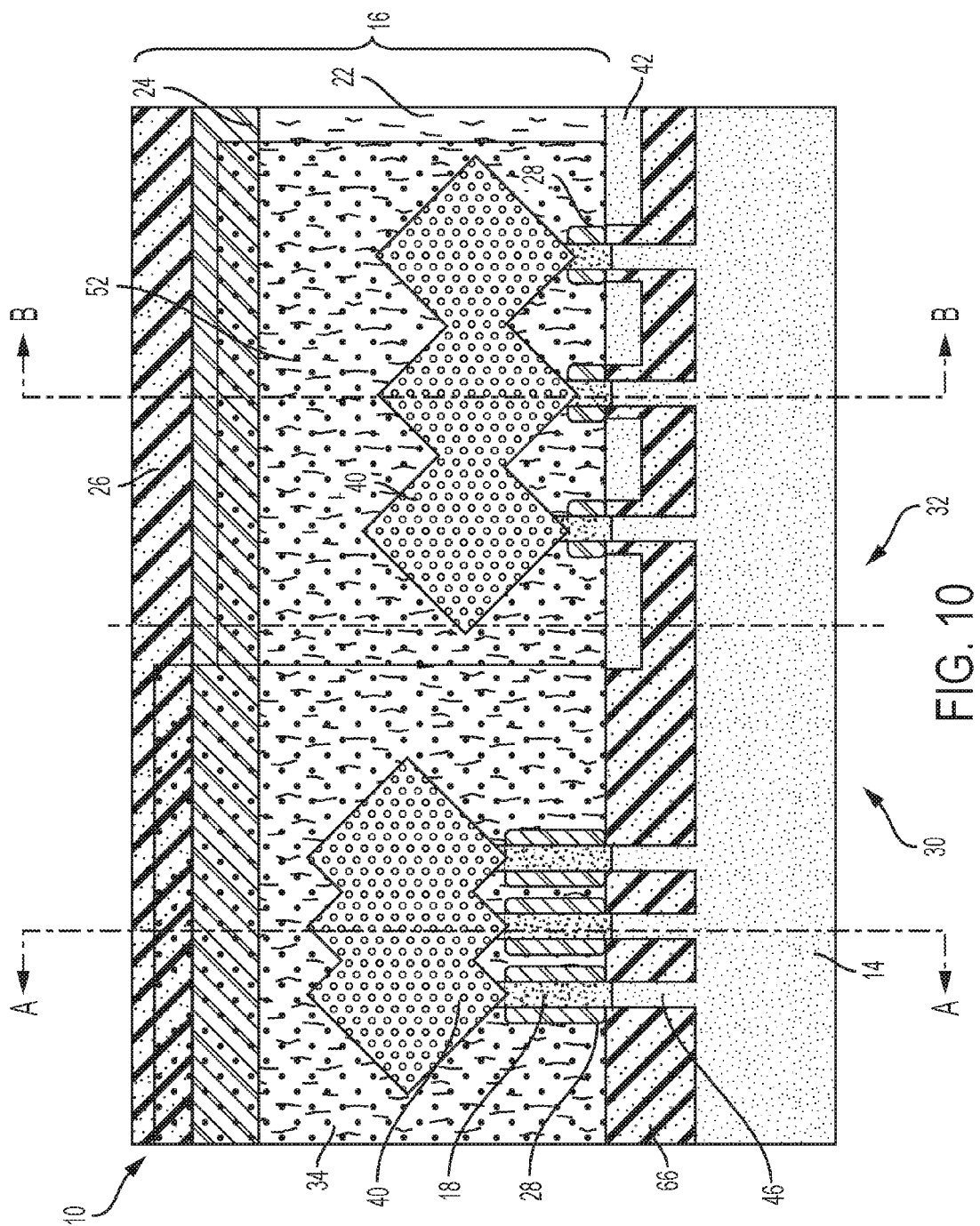
FIG. 10 is a cross-sectional illustration of epitaxy growth on a first set of fins and on a second set of fins.

Turning now to FIG. 10, epitaxy 40 growth is illustrated in first fin pitch area 30 and second fin pitch area 32 around fins 70 and 70. As demonstrated in FIG. 10, epitaxy 40 growth can occur on each of the fins 12 in first fin pitch area 30 and second fin pitch area 32, even with the larger fin pitch 38 in second fin pitch area 32.

The epitaxy 40 growth can have a thickness of about 5 nm to about 80 nm. In another aspect, the epitaxy 40 growth has a thickness of about 10 nm to about 40 nm.

An epitaxial growth process can be used to grow epitaxy 40 (e.g., silicon epitaxy) with various dopants over fins 12. A non-limiting example of a material (element) for the epitaxial layers 401 includes silicon germanium doped with boron for PMOS and silicon carbon doped with phosphorous for NMOS.

The epitaxy 40 can be grown using a growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other processes.

The thickness of the epitaxy 40 in the first fin pitch area 30 and the second fin pitch area 32 can be substantially the same because they will be formed concomitantly through the patterned mask. Because the fin pitch in the first fin pitch area 30 and the second fin pitch area different, epitaxy 40 will protrude from fins 12 by different amounts.

Figure 11:
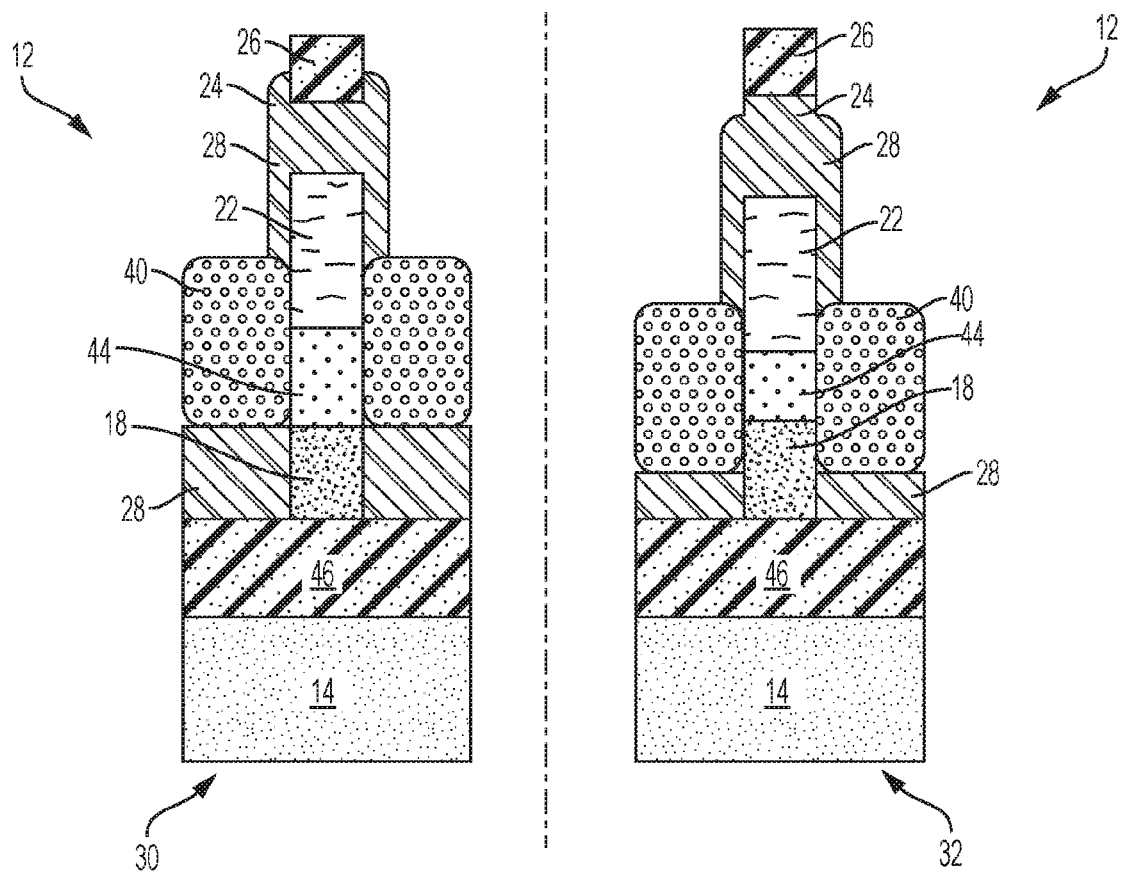
FIG. 11 is a cross-sectional illustration of the finFET structure of FIG. 10, taken across line A-A and line B-B in FIG. 10.

FIG. 11 is a cross-sectional detailed illustration of fin 70 in first fin pitch area 30 and fin 72 second fin pitch area 32. Spacer 28 can be etched around fin 70, 72 and punch through stopper layer 18. Epitaxy 40 can be grown around fin channel 44 and dummy gate 22. As can be seen, spacer 28 located in fin 70 has a higher depth than spacer 28 located in fin 72.

A method of forming a semiconductor can include forming a shallow trench isolation recess 66 on a substrate 14. The shallow trench isolation recess 66 can have a depth of 50-200 nanometers (nm), for example, 50 nm, for example, 10 nm. A first set of fins 70 comprising fins 12 can be formed on the substrate 14 with a punch through stopper layer 18 disposed between the substrate 14 and the first set of fins 70 in first fin region 60. The first set of fins 70 can have a fin pitch 48 of less than or equal to 35 nm, for example, less than or equal to 34 nm, for example, less than or equal to 27 nm and a height of 5-50 nm.

A second set of fins 72 comprising fins 12 can be formed on the substrate 14 with a punch through stopper layer 18 disposed between the substrate 14 and the first set of fins 12 in second fin region 62. The second set of fins 72 can have a fin pitch 38 of greater than 40 nm, for example, greater than or equal to 42 nm, for example, greater than or equal to 45 nm and a height of 5-50 nm. A spacer 28 can be placed around each fin 12 in the first set of fins 70 and in the second set of fins 72. The spacer 28 can be vertically etched around the first set of fins 70. The first set of fins 70 can be blocked and the spacer 28 can be vertically etched around the second set of fins 72. Epitaxy 40 can be grown on the first set of fins 70 and the second set of fins 72. The epitaxy 40 can be merged on the first set of fins 70 and on the second set of fins 72 to form a semiconductor device 10 with a first set of fins 70 and a second set of fins 72.

Each of fins 12 in the first set of fins 70 and the second set of fins 72 can have a height variation of less than or equal to 20 nm, for example, less than or equal to 15 nm, for example, less than or equal to 10 nm, for example, less than or equal to 5 nm.

A gate stack 16 can be etched over a portion of the first set of fins 60 and the second set of fins 62. The gate stack 16 can comprise a dummy gate 22, a first hard mask layer (e.g., a gate oxide hard mask) 24, and a second hard mask layer (e.g., a gate nitride hard mask) 26 disposed between the dummy gate 22 and the first hard mask layer 24.

The punch through stopper layer 18 can form a portion of the fins 70, 72 having a doped layer to assist in preventing source to drain shorts. The punch through stopper layer 18 and fins 70, 72 can be protected with a spacer after reactive ion etching to prevent epitaxy growth.

The substrate 14 can comprise a semiconductor. For example, the substrate 14 can comprise silicon in combination with a Group II to Group V metal, oxides thereof, or a combination comprising at least one of the foregoing.

The spacer 28 can comprise a low-κ dielectric material. For example, the spacer can comprise silicon nitride, silicon boron carbon nitride, silicon oxygen carbon nitride, or a combination comprising at least one of the foregoing.

A fin field effect transistor can be formed from the semiconductor device 10.

A semiconductor device 10 can include a shallow trench isolating recess 66 (e.g., a dielectric layer). The shallow trench isolation recess 66 can have a depth of 50-200 nm. A substrate 14 can be disposed adjacent to the shallow trench isolating recess 66. The semiconductor device 10 can include a vertically etched first set of fins 70 comprising fins 12, where a punch through stopper layer 18 can be disposed between the second set of fins 70 and the substrate 14. The semiconductor device 10 can include a vertically etched second set of fins 72, wherein a punch through stopper layer 18 is disposed between the second set of fins 72 and the substrate 14. A spacer 28 can be disposed around each fin 12 in the first set of fins 70 and in the second set of fins 72. A height of the spacer 28 can be 10-90% smaller as compared to a height of the spacer 28 in the second set of fins 72 after etching the first set of fins 70 and the second set of fins 72.

Epitaxy 40 can be grown on the first set of fins 70 and the second set of fins 72. After growing, the epitaxy 40 on the first set of fins 70 can be merged and the epitaxy 40 on the second set of fins 72 can be merged.

The STI regions 66 are recessed during fin formation. Etching processes can include wet or dry etching process using HF based chemistry to recess the STI regions 66.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a first set of fins on a substrate, wherein the first set of fins have a fin pitch of less than or equal to 35 nanometers;
   forming a second set of fins on the substrate, wherein the second set of fins have a fin pitch of greater than or equal to 40 nanometers;
   forming a gate stack over the fins and substrate;
   depositing a spacer layer around each fin in the first set of fins and in the second set of fins and the substrate;
   etching horizontal and vertical surfaces covered by the spacer layer to form spacers around the first set of fins and the second set of fins;
   blocking the first set of fins with a protective layer;
   etching horizontal and vertical surfaces of the spacer to pull down the spacer around the second set of fins;
   growing an epitaxy layer around the first set of fins and the second set of fins and growing epitaxy on the first set of fins and on the second set of fins;
   merging the epitaxy on the first set of fins; and
   merging the epitaxy on the second set of fins to form a semiconductor device with a first set of fins and a second set of fins adjacent to each other, wherein the first set of fins and the second set of fins have different sizes.

2. The method of claim 1, wherein each of the fins in the first set of fins have a height variation of less than or equal to 5 nanometers and wherein each of the fins in the second set of fins have a height variation of less than or equal to 5 nanometers.

3. The method of claim 1, wherein the gate stack comprises a dummy gate, a gate oxide hard mask, and a gate nitride hard mask disposed between the dummy gate and the gate oxide hard mask.

4. The method of claim 1, further comprising removing the dummy gate and etching a metal gate, forming a replacement metal gate.

5. The method of claim 1, wherein the punch through stopper layer is protected by a spacer material to prevent epitaxy growth during etching of the spacer around the first set of fins or etching of the spacer around the second set of fins.

6. The method of claim 1, wherein the substrate comprises a semiconductor.

7. The method of claim 6, wherein the substrate comprises silicon in combination with a Group II to Group V metal, oxides thereof, or a combination comprising at least one of the foregoing.

8. The method of claim 1, wherein the spacer comprises a low-κ dielectric material.

9. The method of claim 8, wherein, the spacer comprises silicon nitride, silicon boron carbon nitride, silicon oxygen carbon nitride, or a combination comprising at least one of the foregoing.

10. The method of claim 1, further comprising forming a fin field effect transistor from the semiconductor device.

11. A semiconductor device, comprising:
   a first set of fins patterned on a substrate, wherein a punch through stopper layer is arranged between the second set of fins and the substrate;
   a second set of fins patterned on a substrate, wherein a punch through stopper layer is arranged between the second set of fins and the substrate; and
   a gate stack arranged over the first set of fins, second set of fins, and the substrate;
   a spacer arranged around each fin in the first set of fins and around each fin in the second set of fins, wherein a height of the spacer in the first set of fins is 10-90% smaller as compared to a height of the spacer in the second set of fins after etching of the first set of fins and the second set of fins;
   a merged epitaxy layer deposited around the first set of fins; and
   a merged epitaxy layer deposited around the second set of fins.

12. The semiconductor device of claim 11, wherein the first set of fins have a fin pitch and a fin height that is different than a fin pitch and a fin height on the second set of fins.

13. The semiconductor device of claim 12, wherein the first set of fins have a fin pitch of less than or equal to 35 nanometers and a height of 5-50 nanometers.

14. The semiconductor device of claim 12, wherein the second set of fins have a fin pitch of less than or equal to 35 nanometers and a height of 5-50 nanometers.

15. The semiconductor device of claim 12, wherein each of the fins in the first set of fins have a height variation of less than or equal to 5 nanometers and wherein each of the fins in the second set of fins have a height variation of less than or equal to 5 nanometers.

16. The semiconductor device of claim 11, wherein the punch through stopper layer includes an insulating material.

17. The semiconductor device of claim 11, wherein the substrate comprises silicon in combination with a Group II to Group V metal, oxides thereof, or a combination comprising at least one of the foregoing.

18. The method semiconductor device of claim 11, wherein the spacer comprises a low-κ dielectric material.

19. The semiconductor device of claim 11, wherein the semiconductor device is a fin field effect transistor.

20. A method, comprising:
forming a first set of fins on a substrate, wherein the first set of fins has a fin pitch;
forming a second set of fins on the substrate, wherein the second set of fins have a fin pitch, wherein the fin pitch of the first set of fins is smaller than the fin pitch of the second set of fins;
forming a gate stack over the fins and substrate;
depositing a spacer layer around each fin in the first set of fins and in the second set of fins and the substrate;
etching horizontal and vertical surfaces covered by the spacer layer to form spacers around the first set of fins and the second set of fins;
blocking the first set of fins with a protective layer;
etching horizontal and vertical surfaces of the spacer to pull down the spacer around the second set of fins;
growing an epitaxy layer around the first set of fins and the second set of fins and growing epitaxy on the first set of fins and on the second set of fins;
merging the epitaxy on the first set of fins;
merging the epitaxy on the second set of fins to form a semiconductor device with a first set of fins and a second set of fins adjacent to each other; and
removing the dummy gate and etching a metal gate, forming a replacement metal gate.

* * * * *